United States Patent
Gregg et al.

(10) Patent No.: US 6,215,269 B1
(45) Date of Patent: Apr. 10, 2001

(54) METHOD OF EXPOSING A PATH ON A CURVED, OR OTHERWISE IRREGULARLY SHAPED, SURFACE

(76) Inventors: Kent Gregg, 724 Ronalds St., Iowa City, IA (US) 52245; Edwin Wells, Jr., Hickory Hill Orchard, Libertyville, IA (US) 52567

( * ) Notice: Subject to any disclaimer, the term of this patent is extended or adjusted under 35 U.S.C. 154(b) by 0 days.

(21) Appl. No.: 08/651,963

(22) Filed: May 21, 1996

(51) Int. Cl.[7] .............................. G02B 26/10; G02B 6/06; G01B 11/26; G05B 1/06
(52) U.S. Cl. ..................... 318/640; 318/630; 318/685; 356/152; 385/116; 345/8; 359/630
(58) Field of Search .................... 318/560–696; 364/474.02–474.32, 560, 550, 552, 506, 474.37, 563, 507, 577, 470.03; 356/152, 141, 2, 1.5, 381, 237, 376, 124, 446, 394; 359/631, 633, 637, 858, 365; 374/128, 6, 7, 9; 378/901, 21; 250/550, 560; 430/18, 197, 270.1, 277.1, 330, 278.1, 325, 502, 273.1, 309, 394, 302; 219/121.71, 121.7, 121.73; 362/105, 106

(56) References Cited

U.S. PATENT DOCUMENTS

| | | | |
|---|---|---|---|
| 2,705,751 | 4/1955 | Harris et al. ............................ 240/60 |
| 3,790,744 | * 2/1974 | Bowen ........................ 219/121 LM |
| 4,231,079 | 10/1980 | Heminover ............................ 362/106 |
| 4,500,182 | * 2/1985 | Schumann ................................. 354/4 |
| 4,559,516 | 12/1985 | Schott et al. ........................... 340/73 |
| 4,761,056 | * 8/1988 | Evans et al. ......................... 350/174 |
| 4,817,426 | * 4/1989 | Igenbergs et al. ...................... 73/180 |
| 4,862,331 | 8/1989 | Hanabusa ............................. 362/106 |
| 4,874,955 | * 10/1989 | Uesugi et al. ........................ 250/550 |
| 4,901,210 | 2/1990 | Hanabusa ............................. 362/106 |
| 4,908,782 | * 3/1990 | Pekarek et al. ...................... 364/560 |
| 4,920,385 | * 4/1990 | Clarke et al. ......................... 356/237 |
| 4,925,301 | * 5/1990 | Rafanelli .............................. 356/124 |
| 4,933,205 | * 6/1990 | Duley et al. ......................... 427/53.1 |
| 4,949,024 | * 8/1990 | Matsuura ............................. 318/567 |
| 4,956,752 | 9/1990 | Foglietti ................................. 362/72 |
| 4,969,110 | * 11/1990 | Little et al. .......................... 364/550 |
| 5,040,099 | 8/1991 | Harris ................................... 362/72 |
| 5,041,988 | * 8/1991 | Suzuki et al. ........................ 364/506 |
| 5,102,223 | * 4/1992 | Uesugi et al. ....................... 356/376 |
| 5,128,794 | * 7/1992 | Mocker et al. ...................... 359/196 |
| 5,138,368 | * 8/1992 | Kahn et al. ............................. 355/53 |

(List continued on next page.)

*Primary Examiner*—Paul Ip
(74) *Attorney, Agent, or Firm*—Brian J. Laurenzo; Michael G. Gilchrist

(57) ABSTRACT

A circuit on a curved surface is provided where the circuit includes at least one circuit element on the curved surface, at least one conductive path on, and integral with, the curved surface, where the conductive path is connected to the circuit element, and means for supplying power along the conductive path to the circuit element. The curved surface may be a helmet, in which case a plurality of pairs of light emitting elements may be provided thereon where the pairs emit light sequentially one pair at a time in order to maximize the brightness of the light emitted and maximize battery life. Also, means for receiving an infrared or ultrasonic signal may be provided such that the light emitting elements emit light in a certain manner as a result of the signal being received. Also provided is a method of forming at least one conductive path on a curved surface, such as on a helmet, where the method comprises aiming a beam of light to the curved surface, providing relative movement between the beam of light and the curved surface causing the beam of light to form a path on the curved surface, and laying conductive material on the path. The beam of light may be aimed at a mirror which bends the beam of the light to the curved surface, and the mirror may be moved by a stepper motor controlled by a computer. In addition, the curved surface may be moved by a stepper motor controlled by the computer.

13 Claims, 6 Drawing Sheets

U.S. PATENT DOCUMENTS

| | | | |
|---|---|---|---|
| 5,187,540 | * 2/1993 | Morrison | 356/152 |
| 5,207,500 | 5/1993 | Rios et al. | 362/105 |
| 5,208,641 | * 5/1993 | Mocker et al. | 356/5 |
| 5,218,427 | * 6/1993 | Koch | 356/376 |
| 5,257,204 | * 10/1993 | Sawada et al. | 364/474.24 |
| 5,314,249 | * 5/1994 | Marui et al. | 374/128 |
| 5,327,351 | * 7/1994 | Matsuura et al. | 364/474.05 |
| 5,328,811 | * 7/1994 | Brestel | 430/325 |
| 5,341,242 | * 8/1994 | Gilboa et al. | 359/631 |
| 5,357,409 | * 10/1994 | Glatt | 362/105 |
| 5,377,011 | * 12/1994 | Koch | 356/376 |
| 5,396,331 | * 3/1995 | Kitoh et al. | 356/376 |
| 5,402,364 | * 3/1995 | Kitoh et al. | 364/560 |
| 5,416,876 | * 5/1995 | Ansley et al. | 385/116 |
| 5,442,573 | * 8/1995 | Bredberg et al. | 364/563 |
| 5,508,900 | 4/1996 | Norman | 362/106 |
| 5,544,027 | 8/1996 | Orsano | 362/105 |
| 5,580,466 | * 12/1996 | Tada et al. | 216/3 |
| 5,627,771 | * 5/1997 | Makino | 364/560 |
| 5,635,976 | * 6/1997 | Thuren et al. | 347/253 |
| 5,663,885 | * 9/1997 | Stahl | 364/470.05 |
| 5,674,414 | * 10/1997 | Schweizer | 219/121.77 |
| 5,758,947 | * 6/1998 | Glatt | 362/105 |
| 5,962,192 | * 10/1999 | Ho.man III et al. | 430/302 |
| 6,004,734 | * 12/1999 | Berg | 430/502 |
| 6,008,468 | * 12/1999 | Tanaka et al. | 219/121.71 |
| 6,037,085 | * 3/2000 | Holman, III et al. | 430/18 |

* cited by examiner

METHOD OF EXPOSING A PATH ON A CURVED, OR OTHERWISE IRREGULARLY SHAPED, SURFACE

BACKGROUND OF THE INVENTION

This invention relates to a circuit on a curved surface, such as on a helmet, and to a method of forming a portion of the circuit, and more particularly, to a circuit on a curved surface including at least one conductive path integral with the curved surface, and to a method of forming a conductive path on, and integral with, a curved surface.

Presently, circuits are provided only on flat surfaces. This is due to the fact that it has been very difficult to trace and form conductive paths on curved surfaces. Therefore, circuits on curved surfaces typically include a flat circuit board in close proximity to the curved surface. Circuit elements such as light emitting diodes are generally mounted on the curved surface, and the flat circuit board is wired to the circuit elements. Additionally, a battery is typically provided near, and is wired to, the flat circuit board. Wiring from the battery to the flat circuit board, and from the flat circuit board to the circuit elements, enables the flat circuit board to power and operate the circuit elements in a pattern dictated by the circuitry on the flat circuit board.

While these circuits do provide curved surfaces with circuit elements thereon, these circuits are inadequate in many respects. For example, because the circuitry is on a flat circuit board which is not integral with the curved surface, it is necessary to handle the curved surface gently so that the wiring does not disconnect from the circuit elements, the flat circuit board, or the battery. If the curved surface is, in fact, a helmet, such as is shown in U.S. Pat. No. 4,231,079, it is necessary to gently place the helmet over the head and gently remove the helmet from the head in order to prevent the wiring from disconnecting. Furthermore, if the helmet is worn while riding a bicycle, it is possible for the vibrations from the bicycle to cause the wiring to disconnect from the circuit elements, the flat circuit board, or the battery. Of course, if the wiring disconnects, this typically results in a circuit which fails to function properly.

Moreover, these circuits make it necessary to provide or reserve space for the flat circuit board, the battery, and the wiring. For example, if the curved surface is a helmet as shown in U.S. Pat. No. 4,231,079, it is necessary to reserve space within the helmet to accommodate the flat circuit board, the battery, and the wiring therebetween. Therefore, the helmet cannot be designed to precisely fit the head, but instead must be oversized. Not only does oversizing the helmet result in a waste of material, but not designing the helmet to precisely fit the head may result in a helmet which is less effective at protecting the head. Furthermore, the flat circuit board, battery, and wiring within the helmet can injure the wearer of the helmet if the helmet is subjected to impact such as if the helmet is worn while riding a bicycle or motorcycle. Also, the presence of the flat circuit board, battery, and wiring therebetween within the helmet results in the helmet being uncomfortable to the wearer.

The difficulties encountered in the prior art hereinabove are substantially eliminated by the present invention.

SUMMARY OF THE INVENTION

It is an object of the present invention to provide a circuit on a curved surface including a conductive path on, and integral with, the curved surface.

Another object of the present invention is to provide a circuit on a surface of a helmet including a conductive path on, and integral with, the surface.

Yet another object of the present invention is to provide a circuit on a curved surface where the circuit conforms to the curved surface.

Still another object of the present invention is to provide a circuit on a helmet where the circuit is durable and is able to effectively withstand vibrations.

A further object of the present invention is to provide a light system on a bicycle helmet where the circuitry for the light system is on the exterior surface of the helmet.

Still a further object of the present invention is to provide a light system on a helmet where the light system changes its lighting pattern in response to a received signal such as a signal indicating that a bicycle brake has been applied.

A still further object of the present invention is to provide a light system on a curved surface where light emitting elements emit light one pair at a time resulting in bright emission of light and long battery life.

Yet still a further object of the present invention is to provide a light system on a helmet where the light system is not susceptible to moisture such as rain.

Yet a further object of the present invention is to provide a method of forming a conductive path on a curved surface, such as on a helmet.

Yet still another object of the present invention is to provide a method of utilizing a computer to form a conductive path on a curved surface, such as on a helmet.

These, and other objects of the invention, will become apparent upon reference to the following specification, drawings, and claims.

By the present invention, it is proposed to overcome the difficulties encountered heretofore. To this end, a circuit on a curved surface is provided where the circuit includes at least one circuit element on the curved surface, at least one conductive path on the curved surface and connected to the circuit element, and means for supplying power along the conductive path to the circuit element.

In a preferred embodiment, the curved surface is a helmet, in which case a plurality of pairs of light emitting elements are provided where the pairs emit light sequentially one pair at a time in order to maximize the brightness of the light emitted and maximize battery life. Also, means for receiving an infrared or ultrasonic signal is provided such that the light emitting elements emit light in a certain manner as a result of the signal being received.

Also provided is a method of forming at least one conductive path on a curved surface, such as on a helmet, where the method comprises aiming a beam of light to the curved surface, providing relative movement between the beam of light and the curved surface causing the beam of light to form a path on the curved surface, and laying conductive material on the path. The beam of light may be aimed at a mirror which bends the beam of the light to the curved surface, and the mirror may be moved by a stepper motor controlled by a computer. In addition, the curved surface may be moved by a stepper motor controlled by the computer.

DETAILED DESCRIPTION OF THE INVENTION

Figure 1:
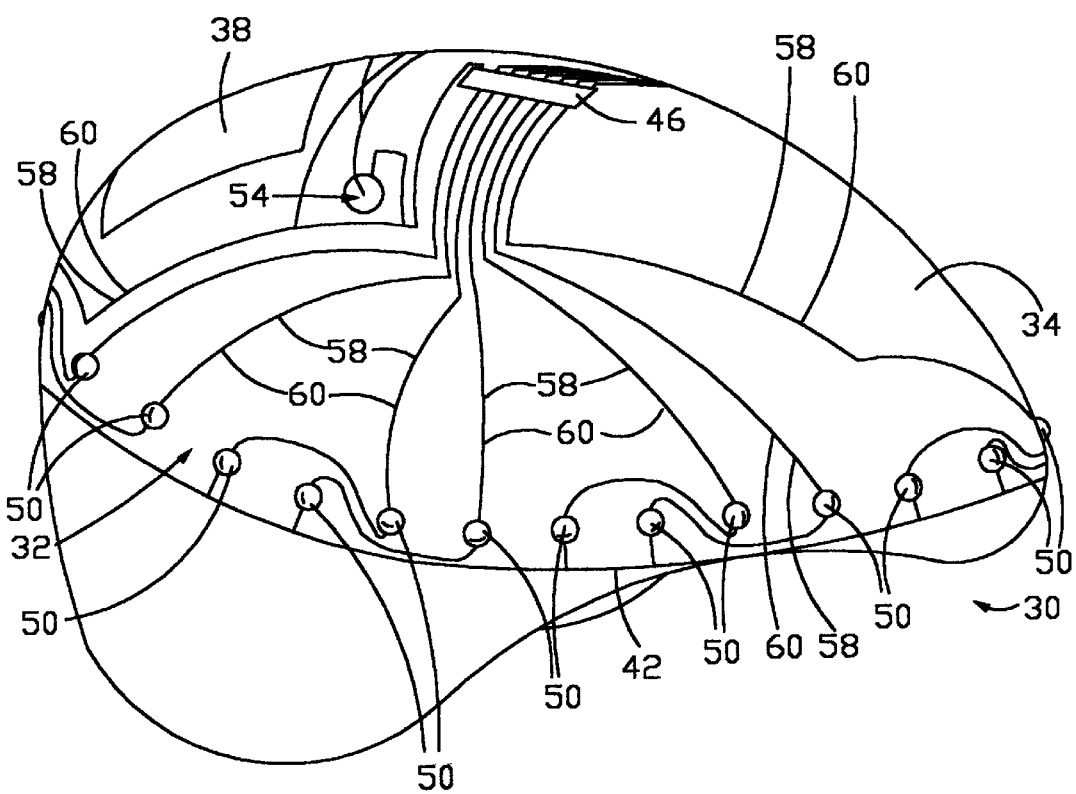
FIG. 1 is a perspective view of a helmet in accordance with the present invention.
Figure 2:
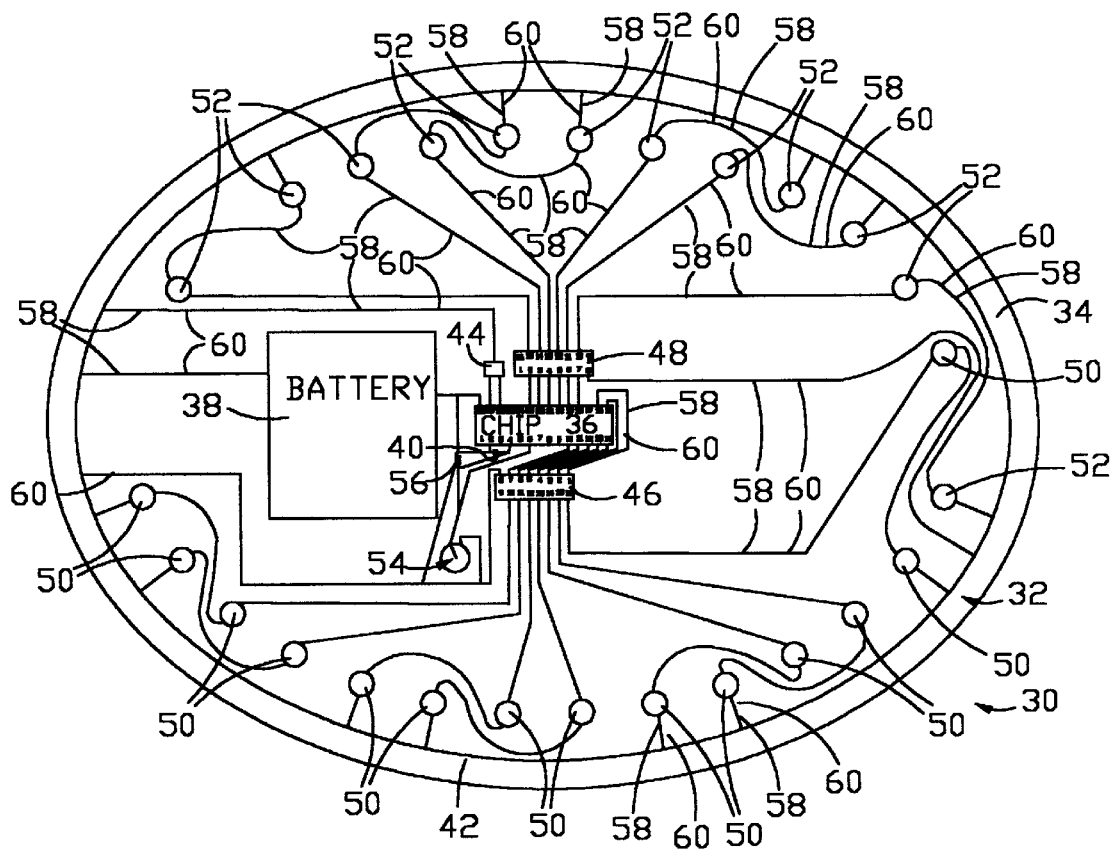
FIG. 2 is a top view of the helmet shown in FIG. 1.

Shown in the figures is a helmet 30 to be worn on the head of a person riding a bicycle or motorcycle (not shown). As shown in FIGS. 1 and 2, the helmet 30 has an electric circuit 32 on the exterior surface 34 of the helmet 30. The electric circuit 32 includes a microprocessing chip 36 which may be chip #PIC16C55 commercially available from Microchip Technology, Inc. at 2355 W. Chandler Blvd. in Chandler, Arizona 85224-6199. The microprocessing chip 36 is powered by a battery 38 which is connected to the microprocessing chip 36 at pin connections 2, 4 and 28 of the microprocessing chip 36 as shown in FIG. 2. As shown, a capacitor 40 is connected to pin connection 2 and pin connection 4 of the microprocessing chip 36. The capacitor 40 shown in FIG. 2 is a sixteen volt capacitor having a capacitance of microfarrad. The battery 38 supplies 4.8 to 5.8 volts of direct current and is connected to a grounding loop 42 which is merely a conductive path around the helmet 30. Also, the microprocessing chip 36 is connected to a resonator 44 at pin connections 26 and 27, and the resonator 44 is connected to the grounding loop 42. Pin connections 10–16 of the microprocessing chip 36 are connected to pin connections 1–7 of a first driver chip 46, and pin connections 18–23 of the microprocessing chip 36 are connected to pin connections 2–7 of a second driver chip 48. Both the first driver chip 46 and the second driver chip 48 may be chip #TPIC2701 commercially available from Texas Instruments, Inc. at 8505 Forest Lane in Dallas, Tex. 75243.

One pair of amber light emitting diodes 50 in series is connected to each of pin connections 10–16 of the first driver chip 46. Each pair of amber light emitting diodes 50 is also connected to the grounding loop 42 as shown in FIG. 2. Likewise, one pair of red light emitting diodes 52 in series is connected to each of pin connections 10–15 of the second driver chip 48. Each pair of red light emitting diodes 52 is also connected the grounding loop 42. Therefore, there are seven pairs of amber light emitting diodes 50 and six pairs of red light emitting diodes 52. The first driver chip 46 is connected to the grounding loop 42 at pin connection 8. Similarly, the second driver chip 48 is also connected to the grounding loop 42 at pin connection 8.

As shown in FIG. 2, pin connection 6 of the microprocessing chip 36 may be connected to means for receiving a signal 54. As mentioned, the helmet 30 shown in the figures is meant to be worn by a person when riding a bicycle or motorcycle, and therefore the means for receiving a signal 54 may be means for receiving a wireless radio frequency, ultrasonic or infrared signal which is transmitted by another device (not shown) as a result of a brake or a turn signal on the bicycle or motorcycle (not shown) being applied. Depending on the type of means for receiving a signal 54 which is, in fact, utilized, it may be appropriate to provide a resistor connected to the means for receiving a signal 54. For example, a resistor 56 is shown in FIG. 2, and the resistor 56 has a resistance of 10k Ohms. One skilled in the art should appreciate that the appropriate strength of the resistor will vary depending on the exact circuitry which is utilized as the means for receiving a signal 54. One skilled in the art should also realize that the helmet 30 shown in the figures may, instead of being designed for a bicycle or motorcycle rider, be specifically designed for other applications in which the wearing of a safety head covering would be desirable.

As shown in FIG. 2, all the connections, as described above, between the battery 38, microprocessing chip 36, first driver chip 46, second driver chip 48, light emitting diodes 50 and 52, resonator 44, capacitor 40, resistor 56, grounding loop 42 and means for receiving a signal 54 are conductive paths 58 on the exterior surface 34 of the helmet 30. The conductive paths 58 preferably comprise copper, but may be of any material which is effectively conductive. Preferably, there is a protective overcoat 60 over the conductive paths 58 so that the conductive paths 58 are not subject to the elements of nature and; therefore, the helmet 30 can be worn outdoors notwithstanding the fact that it may be raining.

In operation, the helmet 30 is worn on the head while riding a bicycle or motorcycle (not shown), and the electric circuit 32 on the exterior surface 34 of the helmet 30 functions as described below. The battery 38 supplies 4.8 to 5.8 volts along conductive paths 58 on the exterior surface 34 of the helmet 30 to pin connections 2, 4 and 28 of the microprocessing chip 36. The microprocessing chip 36 is programmed to send signals from pin connections 10–16, along conductive paths 58 on the exterior surface 34 of the helmet 30, to pin connections 1–7 of the first driver chip 46. The first driver chip 46 responds by sending signals from pin connections 10–16, along conductive paths 58 on the exterior surface 34 of the helmet 30, to the amber light emitting diodes 50 thus causing each pair of amber light emitting diodes 50 to emit light sequentially one pair at a time.

When the means for receiving a signal 54 is, in fact, receiving a signal, the means for receiving a signal 54 sends a signal along a conductive path 58 on the exterior surface 34 of the helmet 30 to pin connection 6 of the microprocessing chip 36. The microprocessing chip 36 then stops sending signals from pin connections 10–16, along conductive paths 58 on the exterior surface 34 of the helmet 30, to pin connections 1–7 of the first driver chip 46, and instead begins sending signals from pin connections 18–23, along conductive paths 58 on the exterior surface 34 of the helmet 30, to pin connections 2–7 of the second driver chip 48. The second driver chip 48 responds by sending signals from pin connections 10–15, along conductive paths 56 on the exterior surface 34 of the helmet 30, to the red light emitting diodes 52 causing each pair of red light emitting diodes 52 to emit light sequentially one pair at a time.

When the means for receiving a signal 54 no longer is receiving a signal, the means for receiving a signal 54 stops sending a signal along a conductive path 58 on the exterior surface 34 of the helmet 30 to pin connection 6 of the microprocessing chip 36, and the microprocessing chip 36 stops sending signals from pin connections 18–23, along conductive paths 58 on the exterior surface 34 of the helmet 30, to pin connections 2–7 of the second driver chip 48, and instead sends signals from pin connections 10–16, along conductive paths 58 on the exterior surface 34 of the helmet 30, to pin connections 1–7 of the first driver chip 46. In much the same manner as before the means for receiving a signal 54 was, in fact, receiving a signal, the first driver chip 46 sends signals from pin connections 10–16, along conductive paths 58 on the exterior surface 34 of the helmet 30, to the amber light emitting diodes 50 thus causing each pair of amber light emitting diodes 50 to emit light sequentially one pair at a time. In this manner, the amber light emitting diodes 50 light sequentially one pair at a time when the means for receiving a signal 54 is not receiving a signal, and the red light emitting diodes 52 light sequentially one pair at a time when the means for receiving a signal 54 is, in fact, receiving a signal.

While the preferred embodiment of the present invention is described hereinabove, alternative embodiments are anticipated. Other alternatives exist, of course, which are not described herein. As mentioned, within the preferred embodiment as shown in FIG. 2, the microprocessing chip 36 is programmed such that only one pair of light emitting diodes 50 or 52 in series is lit at any given time. By lighting only two light emitting diodes 50 or 52 at any one time, battery 38 life is maximized, and the light emitted from the light emitting diodes 50 or 52 can be seen from a distance of over 300 feet from the helmet 30. The light emitted is dramatically brighter than would be emitted if all the light emitting diodes 50 and 52 on the helmet 30 were to emit light simultaneously. However, it is possible to provide that a greater or lesser number than a pair of light emitting diodes 50 or 52 are lit at any given time. It is also possible to provide other lights on the helmet 30 which serve other functions than the light emitting diodes 50 and 52 as described above. For example, it is possible to provide the helmet 30 with a switchable, aimable forward facing light for map reading, repair, etc (not shown).

While FIG. 2 shows the light emitting diodes 50 and 52 positioned in a straight line 360 degrees around the helmet 30 so that at least one light emitting diode 50 or 52 is visible no matter from what angle the helmet is viewed, it is possible to provide the light emitting diodes 50 and 52 in other positions. For example, it is possible to position the red light emitting diodes 52 on the helmet 30 in a "U" shape, and position the amber light emitting diodes 50 in an upside-down "U" shape.

Also, the microprocessing chip 36 can be programmed such that all the red light emitting diodes 52 light at the same time when the means for receiving a signal 54 is receiving a signal such as that the brake on a bicycle or motorcycle is being applied (not shown), and that all the amber light emitting diodes 52 light at the same time when the means for receiving a signal 54 is not receiving this signal. There are, of course, other positions and sequences of lighting the light emitting diodes 50 and 52 on the helmet 30 which can be utilized in order to maximize the safety of the wearer of the helmet 30, to maximize the aesthetic appearance of the helmet 30, or to achieve any other function which the helmet 30 is directed to achieve, such as if the helmet 30 is designed to be worn by a person while working on a roadway, at a construction site, in a factory, etc. It is, of course, also possible to provide a greater or lesser number of light emitting diodes 50 and 52 on the helmet than is described within the preferred embodiment, or to provide different circuit elements within the electric circuit 32 on the helmet 30. One skilled in the art should realize that by using a microprocessing chip 36, there are endless alternatives to programming lighting sequences of the light emitting diodes 50 and 52. For example, it is possible to incorporate a selection switch (not shown) on the helmet 30 which would allow the wearer of the helmet 30 to select between many different lighting patterns and sequences.

Also, it is possible to entirely omit the means for receiving a signal 54 from the electric circuit 32. Or, it is possible to provide that the means for receiving a signal 54 is means for receiving a signal which is transmitted by another device as a result of the occurrence of some other event other than the actuation of a brake or turn signal on a bicycle or motorcycle. For example, a signal may be transmitted and then received by the means for receiving a signal 54 as a result of impending danger having been detected. Or, it is possible that the helmet 30 (or any other article of apparel having conductive paths thereon as described herein with relation to the helmet 30) be designed to be worn by a child who is carrying a toy gun (not shown). When a trigger on the toy gun is actuated by the child, a signal to that effect is transmitted by the gun, and this signal is received by the means for receiving a signal 54 which is on the helmet 30. Consequently, the microprocessing chip 36 causes the light emitting diodes 50 and 52 to emit light in a distinctive pattern in much the same manner as described above.

Additionally, it is possible to provide the electric circuit 32 on some curved surface other than on a helmet 30. For example, it is possible to provide the electric circuit 32 on in-line skates, shoes, bicycle accessories, running clothes, or any other articles of apparel such as a vest (not shown). It is, of course, also possible to provide the electric circuit 32 on a curved surface which is actually planar piecewise. In fact, it is anticipated that the electric circuit 32 can be provided on virtually any irregular surface.

In manufacturing the helmet 30 described above, it is possible to utilize the following method for exposing paths on a curved surface in combination with other industry-known methods. Of course, the following can be utilized to expose paths on a curved surface which is actually planar piecewise, or to expose paths on virtually any irregular surface. One industry-known method is a method presently marketed by Amp-Akzo of 710 Dawson Drive, Newark, Del. 19713. The Amp-Akzo method is a positive, or additive process, of laying conductive paths on a flat surface. Pursuant to the Amp-Akzo method, typically the flat surface is subjected to a seed chemical bath whereby the seed chemical is deposited onto the flat surface, a photosensitive material is placed over the seed chemical, paths are exposed onto the photosensitive material, and then the paths are subjected to a series of electroless baths whereby a conductive material is placed along the exposed paths. While the Amp-Akzo method is effective at providing conductive paths on a flat surface, the method is not effective with curved surfaces due to the difficulty in exposing paths on a curved surface. However, as described below, the Amp-Akzo method may be used in combination with the herein described method of exposing paths on a curved surface.

Figure 3:
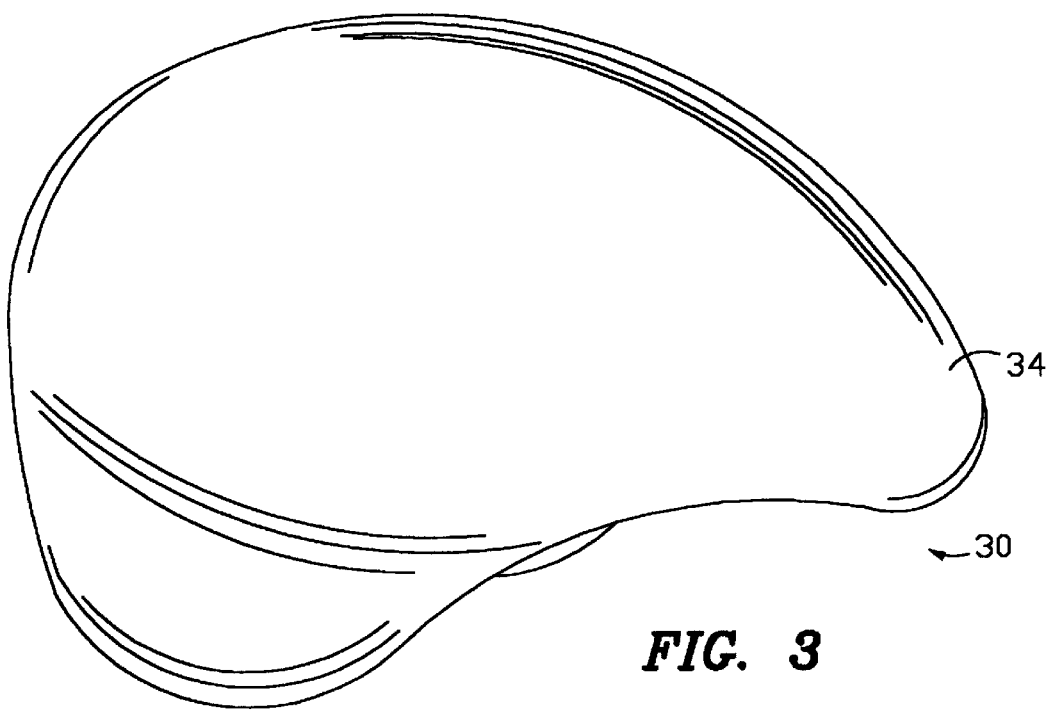
FIG. 3 is a perspective view of a helmet in accordance with the present invention.
Figure 4:
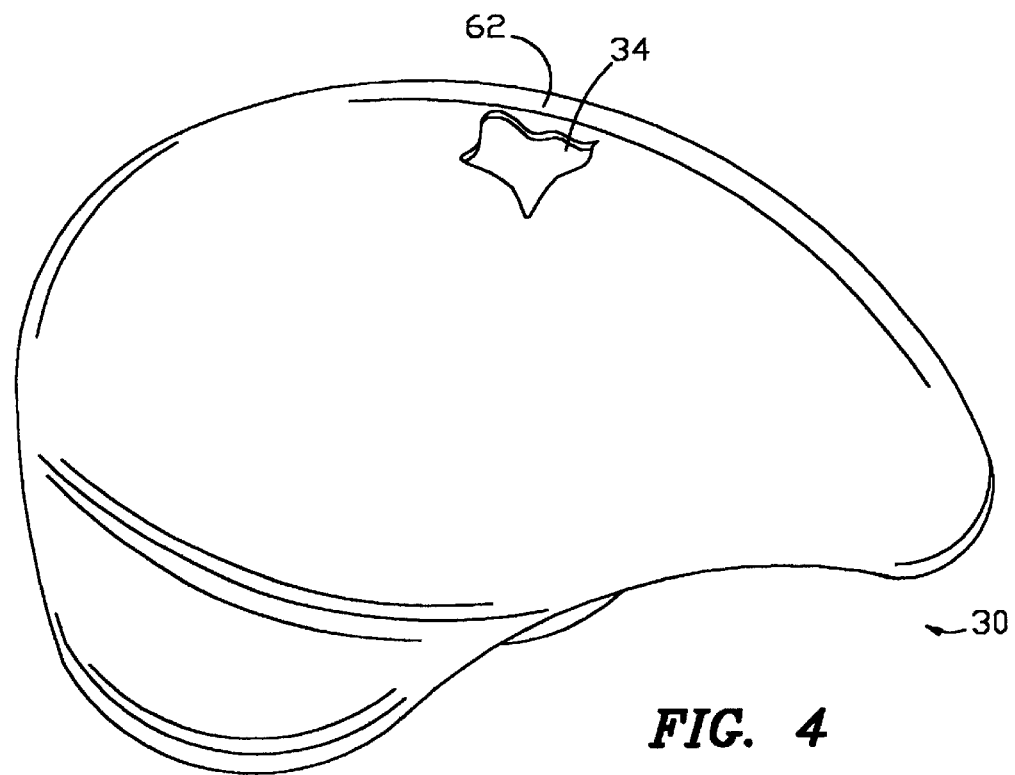
FIG. 4 is a perspective view of the helmet shown in FIG. 3 after a seed chemical has been applied to the helmet.
Figure 5:
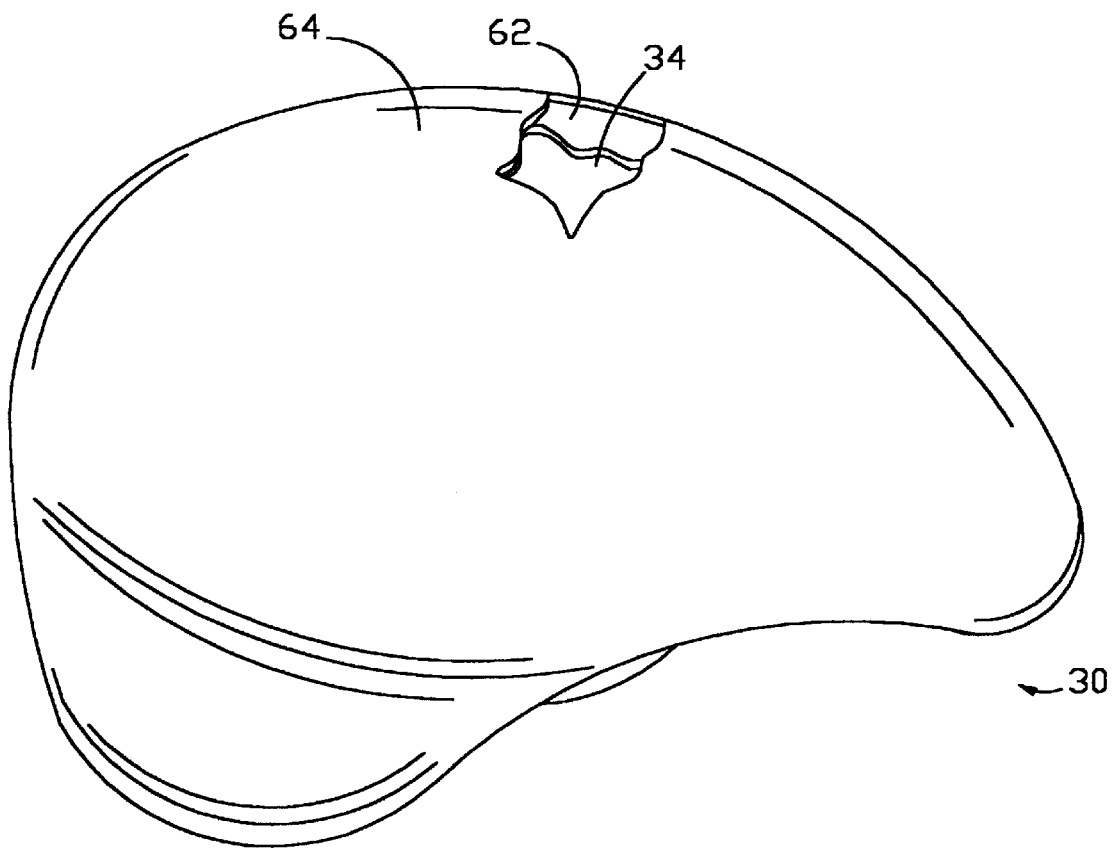
FIG. 5 is a perspective view of the helmet shown in FIG. 4 after a photosensitive material has been placed over the helmet.

Initially, a typical, commercially available, helmet 30 is provided as shown in FIG. 3. Next, a seed chemical 62 is applied to the exterior surface 34 of the helmet 32 as shown in FIG. 4. This application of a seed chemical 62 to the helmet 30 is in accordance with the known Amp-Azko method and should be well understood by one of ordinary skill in the art. Then, a photosensitive material 64 is placed over the helmet 30 as shown in FIG. 5. Next, paths 66 are exposed onto the photosensitive material 64 on the helmet 30 using the following method of exposing paths on a curved surface.

Figure 6:
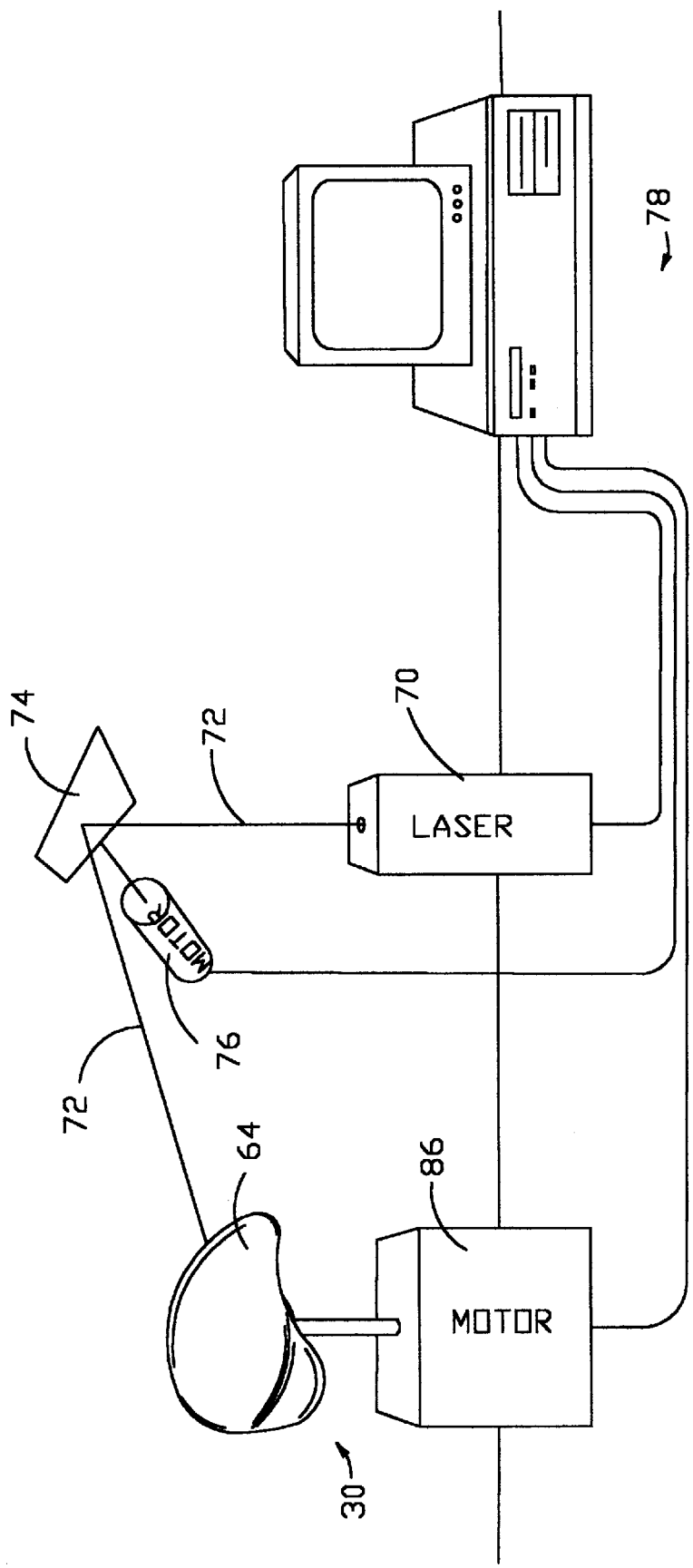
FIG. 6 is a plan view showing the practicing of a method of exposing paths on the helmet shown in FIG. 5.
Figure 7:
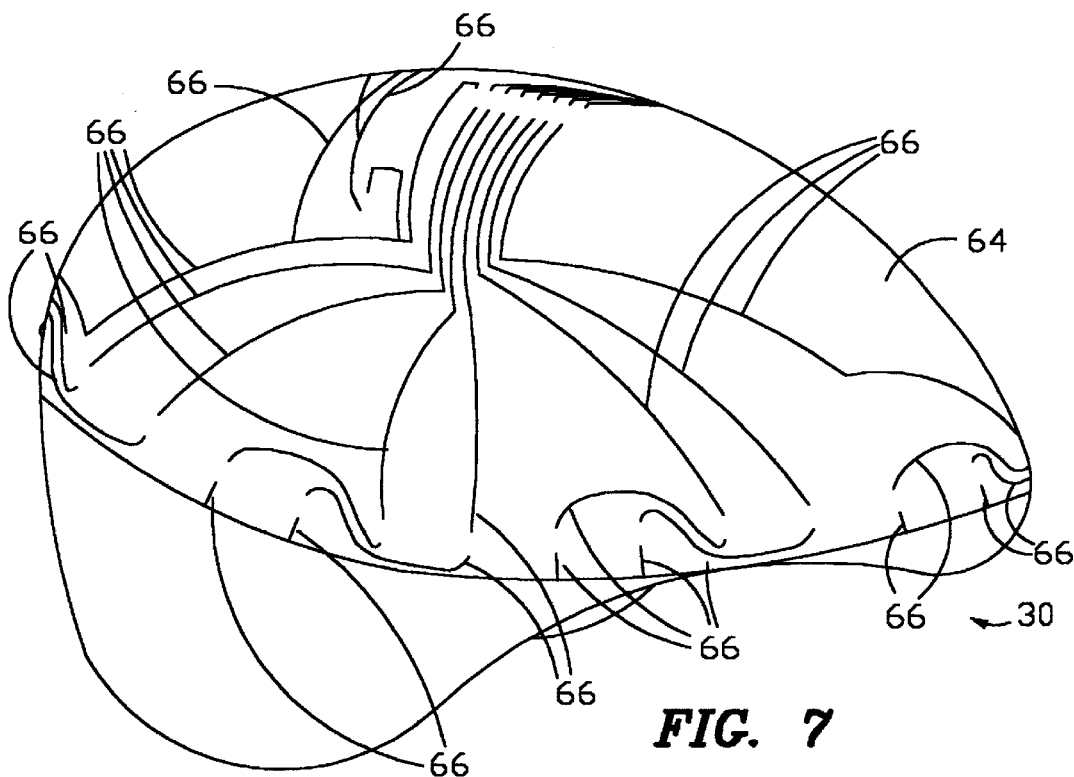
FIG. 7 is a perspective view of the helmet shown in FIG. 5 after paths have been exposed on the helmet.

First, the helmet 30 is placed under the directive control of a first stepper motor 68 as shown in FIG. 6, where the first stepper motor 68 is able to rotate the helmet 30 in a horizontal direction. A laser 70 is used to shine a laser beam 72 vertically at a mirror 74 which bends the laser beam 72 to the helmet 30. As shown in FIG. 6, the mirror 74 may be under the directive control of a second stepper motor 76, where the second stepper motor 76 is able to rotate the mirror 74 in a vertical direction. Both the first stepper motor 68 and the second stepper motor 76 are connected to, and in communication with, a computer 78. The laser 70 is also connected to, and in communication with, the computer 78. The computer 78 is programmed such that the computer 78 simultaneously directs the first stepper motor 68 to rotate the helmet 30 horizontally and directs the second stepper motor 76 to rotate the mirror 74 vertically. By moving the helmet 30 in one degree of freedom and the mirror 74 in the other degree of freedom while aiming the laser beam 72 at the helmet 30, it is possible to aim the laser beam 72 to any point on the exterior surface 34 of the helmet 30. At the same time the stepper motors 68 and 76 are moving the helmet 30 and the mirror 74, respectively, the computer 78 turns the laser 70 on in order to expose the paths 66 on the helmet 30 as shown in FIG. 7, and turns the laser 70 off, by shuttering or by altering the electrical excitation of the laser beam 72, when the laser beam 72 must be moved to a different point on the helmet 30 without exposing a path 66. In this manner, all the necessary paths 66 as shown in FIG. 7 may be exposed including the grounding loop 42.

In providing that the computer 78 effectively operate the first stepper motor 68, the second stepper motor 76 and the laser 70 to precisely expose the paths 66 shown in FIG. 7, the computer 78 may be pre-programmed to direct the first stepper motor 68, second stepper motor 76, and laser 70 to precisely trace and expose these paths 66, or the computer 78 may be supplied with software such that the mirror 74 and helmet 30 are first guided manually along the paths 66 to be exposed thus resulting in the computer 78 forming discrete data points, and thus "learning" the paths 66. The software then smoothes out these discrete data points, and then the software can direct the computer 78 to operate the first stepper motor 68, the second stepper motor 76 and the laser 70 in order to smoothly and automatically trace out and expose the paths 66. Subsequently, there would be no need to manually guide the mirror 74 or helmet 30 again in order to expose the same paths 66 on an identically-shaped curved surface since the computer 76 would be able to repeat the same process as a result of what it has "learned" through the manual guiding of the mirror 74 and helmet 30.

Figure 8:
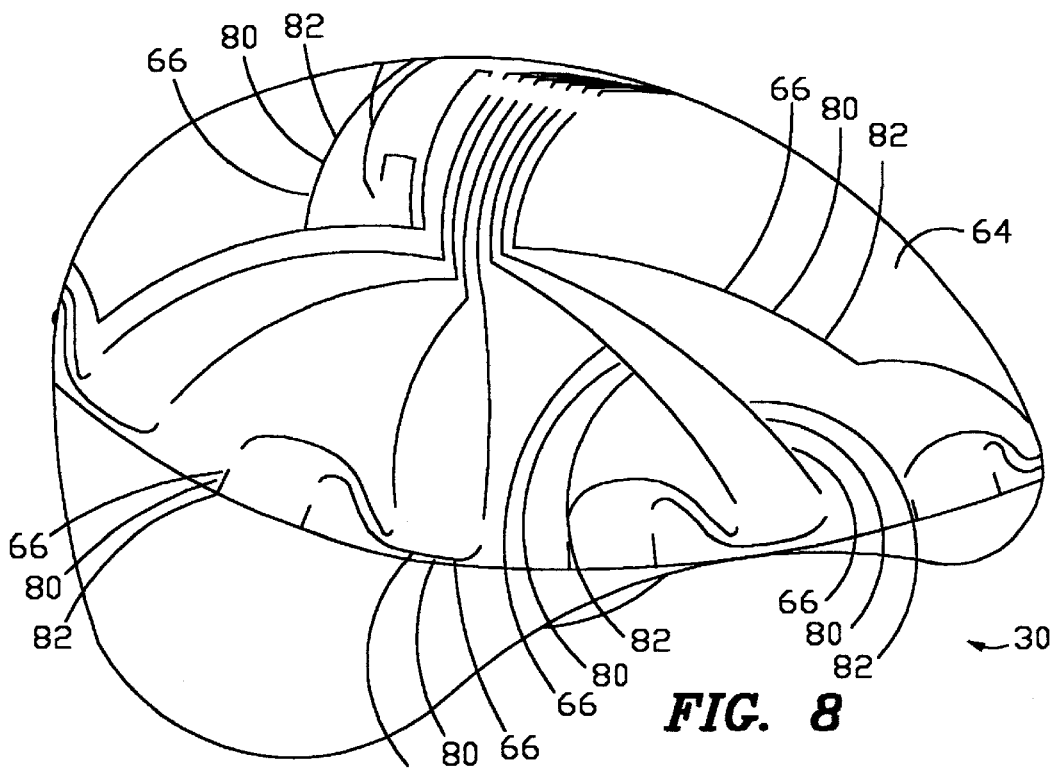
FIG. 8 is a perspective view of the helmet shown in FIG. 7 after conductive material has been placed along the paths.

Next, a conductive material 80, as shown in FIG. 8, is placed along the paths 66 exposed by the laser beam 72. This conductive material 80 may be placed along the paths 66 using electroless baths within the Amp-Akzo method as discussed above or by using some other method such as by sputtering conductive metal along the paths 66 under a vacuum. Preferably, the conductive material 80 comprises copper, but any material may be used so long as the material is adequately conductive. For example, the conductive material 80 may be comprised of silver which can be applied by using a conductive ink pen or conductive epoxy available through Allied Electronics, Inc. in Cedar Rapids, Iowa, from Circuit Works in Kennesaw, Ga.

Then, a protective overcoat 82 is applied over the paths, and the protective overcoat 82 can be applied by using an overcoat pen also available through Allied is Electronics, Inc. from Circuit Works. Finally, the resonator 44, battery 38, capacitor 40, resistor 56, first driver chip 46, second driver chip 48, microprocessing chip 36, light emitting diodes 50 and 52, and means for receiving a signal 54 are added to the helmet shown in FIG. 8 thus resulting in the helmet shown in FIGS. 1 and 2.

An anticipated alternative to the method described above is to either move the helmet in both degrees of freedom while keeping the mirror stationary, to move the mirror in both degrees of freedom while keeping the helmet stationary, or to move both the mirror and the helmet in both degrees of freedom.

Other alternative methods of exposing paths on the helmet include laying an opaque plastic helmet mask shaped to fit tightly over the photosensitive material on the helmet, where the helmet mask has pieces cut out corresponding to the paths which are to be exposed. After the helmet mask is placed over the photosensitive material, a flash exposure is taken of the helmet in order to expose the paths onto the photosensitive material. The method described above with relation to FIG. 6 can be used to produce the cut out areas on the plastic helmet mask by having the laser beam be strong enough to cut out areas of the helmet mask where paths are to be exposed later using a flash exposure.

Still other methods include applying conductors to a flexible material to which is applied an elastic band which gathers the flexible material and conductors together in such a way that the flexible material may be stretched to conform to irregular surfaces, such as helmets, of different shapes and sizes. The elastic band resembles that of common "boxer shorts," but the elastic band used on the helmet is readily stretchable in two directions rather than one. Alternatively, it is possible to weave the conductors actually into the flexible material.

By providing conductive paths on a curved surface, and a method for forming same, such as on the exterior surface of a helmet, it is possible to provide a light system having circuitry which conforms to the shape of the helmet. As a result, the light system is durable and is able to effectively withstand vibrations coming from a bicycle or motorcycle. Also, the helmet is more comfortable than if the circuitry for the light system were to be provided within the helmet. Also, by providing the circuitry on the exterior surface of the helmet, the helmet may be more precisely sized to fit the head thus resulting in the helmet being more effective at protecting the head of the wearer. Additionally, the exposed circuitry on the helmet could also add a very distinctive and aesthetically pleasing appearance.

The foregoing description and drawings merely explain and illustrate the invention. The invention is not limited thereto, except insofar as the claims are so limited, as those skilled in the art who have a disclosure before them will be able to make modifications and variations therein without departing from the scope of the invention. For example, it is anticipated to be within the scope of the invention that the helmet may be of a shape different than that depicted herein, or that conductive paths be provided on curved surfaces other than on a helmet to be worn on the head while riding a bicycle or motorcycle.

What is claimed is:

1. A method of exposing and producing at least one path on one of a curved surface and an irregular surface, said method comprising:

(a) aiming a beam of light to said surface;

(b) providing relative movement between said beam of light and said surface, wherein the act of providing relative movement includes aiming the beam of light at a mirror, wherein the mirror reflects the beam of light toward the surface, providing a first stepper motor in communication with a computer, the first stepper motor being connected to the surface for movement of the surface relative to the laser beam under the direction of the computer, providing a second stepper motor in communication with the computer, the second stepper motor being connected to the mirror for movement of the laser beam relative to the surface in a different degree of motion than the first stepper motor, wherein actuation of the first stepper motor and second stepper motor allow the beam of light to strike the entire surface; and (c) using said beam of light to expose the path on said surface.

2. The method according to claim 1, further comprising laying conductive material on said path to form a conductive path after said act of using said beam of light to expose the path.

3. The method according to claim 2, wherein said step of laying a conductive material comprises subjecting said path to an electroless bath.

4. The method of claim 1, further comprising applying a photosensitive material on said surface prior to the act of using said beam of light to expose a path, and wherein the act of using said beam of light to expose a path comprises subjecting the photosensitive material to said beam of light to form the path.

5. A method for producing at least one conductive path on one of a curved surface and an irregular surface, the method comprising:
(a) applying a seed chemical to the surface;
(b) shining a laser beam at the surface; and
(c) providing relative movement between the laser beam and the surface to expose a conductive path on the surface with the laser beam, wherein the act or providing relative movement includes aiming the laser beam at a mirror, wherein the mirror reflects the laser beam toward the surface, providing a first stepper motor in communication with a computer, the first stepper motor being connected to the surface for movement of the surface relative to the laser beam under the direction of the computer, providing a second stepper motor in communication with the computer, the second stepper motor being connected to the mirror for movement of the laser beam relative to the surface in a different degree of motion than the first stepper motor, wherein actuation of the first stepper motor and second stepper motor allow the beam of light to strike the entire surface.

6. The method of claim 5 further comprising subjecting the exposed path to an electroless bath.

7. The method of claim 5, wherein the act of applying a protective overcoat comprises using an overcoat pen to apply the protective overcoat.

8. The method of claim 5, further comprising placing photosensitive material over the surface prior to act (c) and applying a protective overcoat over the conductive path after act (c).

9. A method of producing at least one path on one of a curved surface and irregular surface, the method comprising:
(a) shining a laser beam at the surface;
(b) providing relative movement between the laser beam and the surface, wherein the act or providing relative movement includes aiming the laser beam at a mirror, wherein the mirror reflects the laser beam toward the surface, providing a first stepper motor in communication with a computer, the first stepper motor being connected to the surface for movement of the surface relative to the laser beam under the direction of the computer, providing a second stepper motor in communication with the computer, the second stepper motor being connected to the mirror for movement of the laser beam relative to the surface in a different degree of motion than the first stepper motor, wherein actuation of the first stepper motor and second stepper motor allow the beam of light to strike the entire surface;
(c) exposing the path on the surface by using the laser beam to create the path on the surface; and
(d) laying conductive material on the path to form a conductive path.

10. The method of claim 9 wherein the act of exposing the path comprises cutting the surface with the laser beam.

11. The method of claim 9 wherein the act of exposing the path comprises etching the surface with the laser beam.

12. The method of claim 9 wherein the strength of the laser beam may be altered.

13. The method of claim 9 wherein the act of exposing the path comprises burning the surface with the laser beam.

* * * * *